US006414536B1

(12) United States Patent
Chao

(10) Patent No.: US 6,414,536 B1
(45) Date of Patent: Jul. 2, 2002

(54) ELECTRICALLY ADJUSTABLE CMOS INTEGRATED VOLTAGE REFERENCE CIRCUIT

(76) Inventor: Robert L. Chao, 14555 Harvard Ct., Los Altos, CA (US) 94022

( * ) Notice: Subject to any disclaimer, the term of this patent is extended or adjusted under 35 U.S.C. 154(b) by 0 days.

(21) Appl. No.: 09/632,407

(22) Filed: Aug. 4, 2000

(51) Int. Cl.[7] ........................................ H03K 17/72
(52) U.S. Cl. ........................................ 327/540; 327/563
(58) Field of Search ........................................ 327/530, 534, 327/535, 537, 538, 540, 541, 543, 545, 546, 560, 561, 562, 563

(56) References Cited

U.S. PATENT DOCUMENTS 5,309,009 A 5/1994 Chao .......................... 257/318
5,963,084 A * 10/1999 Eschauzier .................. 327/553
6,133,780 A * 10/2000 Chi ............................ 327/541

* cited by examiner

*Primary Examiner*—Jeffrey Zweizig
(74) *Attorney, Agent, or Firm*—Jeffrey Moy; Harry M. Weiss; Weiss & Moy, P.C.

(57) ABSTRACT

An improved voltage reference circuit relies on electrically adjustable analog devices fabricated on a common substrate. The circuit has two electrically adjustable matched transistor pairs. A first matched transistor pair includes an adjusting transistor and a differential pair transistor. A second matched transistor pair also includes an adjusting transistor and a differential pair transistor. Each of the matched transistor pairs share an insulated gate or electrically connected insulated gates. Geometrical and electrical matching occurs as between the two adjusting transistors and between the two differential pair transistors. The two differential pair transistors are electrically connected at the source terminals to form a differential circuit. A feedback loop, which includes an amplifier, a fixed resistor and a current source complete the circuit.

20 Claims, 1 Drawing Sheet

ELECTRICALLY ADJUSTABLE CMOS INTEGRATED VOLTAGE REFERENCE CIRCUIT

BACKGROUND OF THE INVENTION

1. Field of the Invention

This invention relates generally to semiconductor integrated circuit devices. More specifically, this invention relates to an integrated voltage reference circuit.

2. Description of the Related Art

Many analog circuit applications require the presence of a voltage reference function. One prior art approach to fulfill the voltage reference function is the employment of zener diodes, typically buried zener diodes. Other prior art voltage reference techniques, such as bandgap voltage reference circuits rely on bipolar transistor device. The disadvantages of these prior art solutions is that the process requirements for fabrication are typically inconsistent with integrated circuits that are fabricated using CMOS technology.

Therefore, a need exists to provide an integrated voltage reference circuit using conventional CMOS fabrication processes. Performance and flexibility would be enhanced by having the CMOS reference voltage circuit electrically adjustable to suit the requirements of various applications.

BRIEF SUMMARY

It is an object of this invention to provide an integrated voltage reference circuit using conventional CMOS technology and fabrication methods.

It is another object of this invention to provide an integrated voltage reference circuit that is electrically adjustable.

An improved voltage reference circuit is comprised of electrically adjustable analog devices fabricated on a common substrate. The circuit comprises two electrically adjustable matched transistor pairs. A first matched transistor pair comprises an adjusting transistor and a differential pair transistor. A second matched transistor pair also comprises an adjusting transistor and a differential pair transistor. Each of the matched transistor pairs share an insulated gate or electrically connected insulated gates. Geometrical and electrical matching occurs as between the two adjusting transistors and the two differential pair transistors. The two differential pair transistors are electrically connected at the source terminals to form a differential circuit. A feedback loop is comprised of an amplifier, a fixed resistor and a current source or load.

The foregoing and other objects, features, and advantages of the invention will be apparent from the following, more particular, description of the preferred embodiments of the invention, as illustrated in the accompanying drawing.

BRIEF DESCRIPTION OF THE SEVERAL VIEWS OF THE DRAWINGS

The FIGURE is a schematic diagram of one embodiment of the present invention.

DETAILED DESCRIPTION

Figure 1:
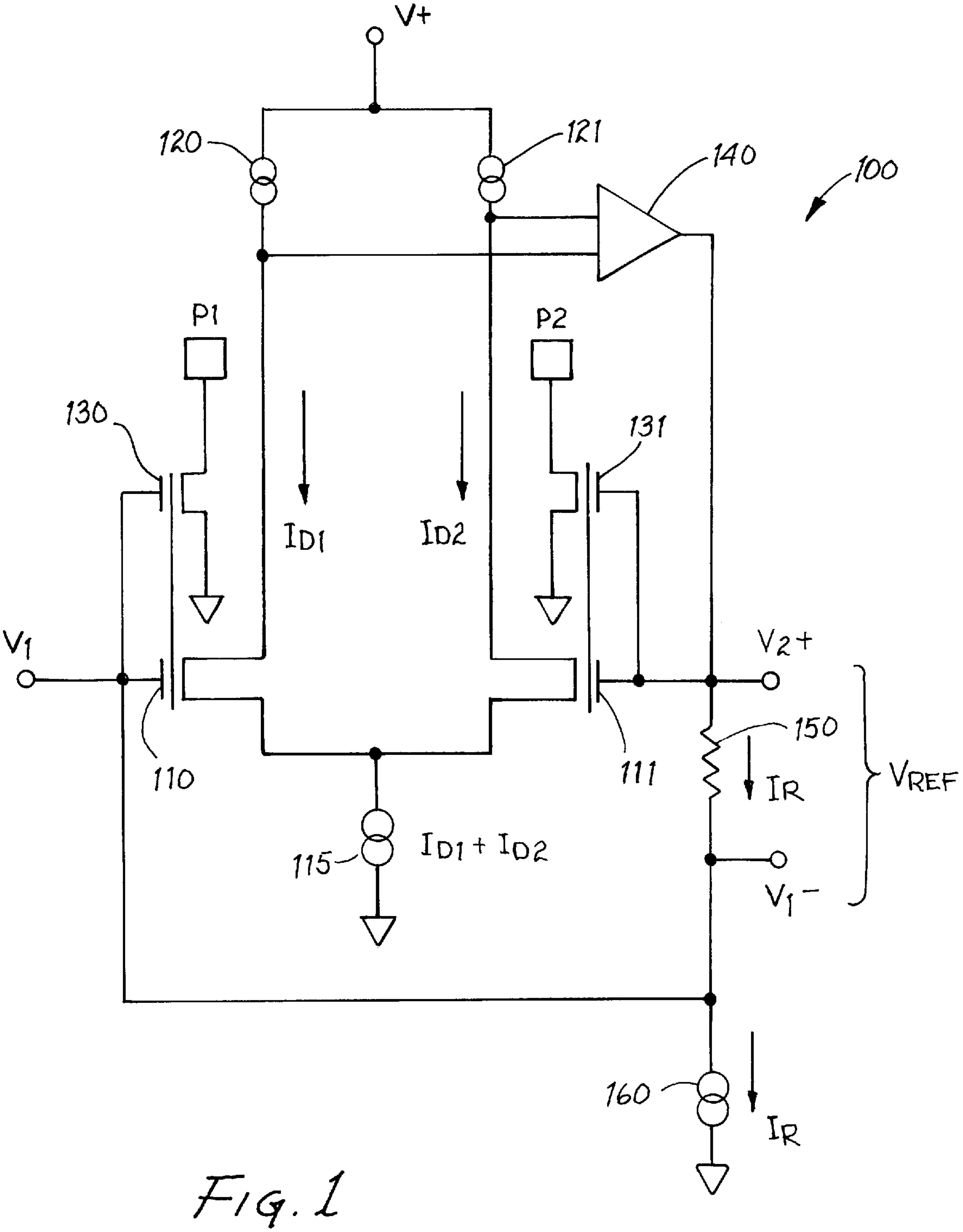

Referring to the FIGURE, one embodiment of the present invention is illustrated. The electrically adjustable integrated voltage reference circuit (circuit) 100 is comprised of a differential pair transistors, i.e. differential pair transistor 110 and differential pair transistor 111. These differential pair transistors are typically Metal Oxide Semiconductor (MOS) or Complementary Metal Oxide Semiconductor (CMOS) devices which share a common substrate. The geometries of differential pair transistor 110 and differential pair transistor 111 are purposefully matched by design, i.e. length and width, such that they share common electrical characteristics in response to external parameters such as temperature variation.

The drain terminal of differential pair transistor 110 is electrically connected to an independent current load 120, which produces drain current $I_{D1}$ through differential pair transistor 110. The drain terminal of differential pair transistor 111 is electrically connected to a second independent current load 121, which produces drain current $I_{D2}$ through differential pair transistor 111. The loads 120 and 121, which are matched in geometry and electrical characteristics, are connected to a supply voltage $V^+$.

The source terminal of differential pair transistor 110 is electrically connected to the source terminal of differential pair transistor 111 and to a current source 115. Thus, the combined electrical current through the current source 115 is $I_{D1}+I_{D2}$.

The circuit 100 is further comprised of adjusting transistor 130 and adjusting transistor 131. These adjusting transistors 130 and 131 are typically MOS or CMOS devices which share a common substrate with the differential pair transistors 110 and 111. The geometries of adjusting transistor 130 and transistor 131 are purposefully matched by design, i.e. length and width, such that they share common electrical characteristics in response to external parameters such as temperature variation.

In one embodiment, the electrical characteristics of the adjusting transistors 130 and 131 are not matched to the electrical characteristics of the differential pair transistors 110 and 111. However, in alternate embodiments, when the electrical characteristics of the adjusting transistors 130 and 131 are matched to the electrical characteristics of the differential pair transistors 110 and 111, respectively, the adjusting transistors 130 and 131 no longer serve an independent function and the circuit may be reduced, from a transistor perspective, to the differential pair transistors 110 and 111.

The gate terminal of adjusting transistor 130 is electrically connected to the gate terminal of the differential pair transistor 110. Differential pair transistor 110 shares a common floating or insulated gate with adjusting transistor 130. The drain terminal of adjusting transistor 130 is connected to charge injection input $P_1$ and the source terminal is connected to ground potential.

The gate terminal of adjusting transistor 131 is electrically connected to the gate terminal of the differential pair transistor 111. Differential pair transistor 111 shares a common floating or insulated gate with adjusting transistor 131. The drain terminal of adjusting transistor 131 is connected to charge injection input $P_2$ and the source terminal is connected to ground potential.

A feedback loop connects the drain terminals of the differential pair transistors 110 and 111 with the gate terminals of the differential pair transistors 110 and 111 and the gate terminals of the adjusting transistors 130 and 131. The drain terminal of differential pair transistor 110 is electrically connected to an input terminal of amplifier 140. The drain terminal of differential pair transistor 111 is electrically connected to another input terminal of amplifier 140.

The output of amplifier 140 is electrically connected to the gate terminal of differential pair transistor 111, to the gate terminal of adjusting transistor 131 and to one terminal of resistor 150. The other terminal of resistor 150 is connected to the gate terminal of differential pair transistor 110 and to the gate terminal of adjusting transistor 130. The resistor 150 is also connected to a bias current source or load 160, which is connected to ground potential. The output of the circuit 100, $V_{REF}$, is the differential as between $V_2$ and $V_1$, as indicated by the output nodes, or $V_{REF}=V_2-V_1$.

The amplifier 140, sensing the drain currents $I_{D1}$ and $I_{D2}$, amplifies any difference as between the drain voltages of differential pair transistors 110 and 111. In the equilibrium state, the $I_{D1}$ is equal to $I_{D2}$ and the output of the amplifier is different from $I_{D2}$, the amplifier produces a bias current $I_R$. Bias current $I_R$ propagates through the resistor 150 and through the bias current source 160. The voltage drop across resistor 150, resulting from the bias current $I_R$, produces the differential as between $V_2$ and $V_1$.

When the differential pair transistors 110 and 111 and the adjusting transistors 130 and 131 are initially powered up, the two differential pair transistors 110 and 111, each having equal electrical characteristics, will develop a gate voltage requirement to maintain drain currents such that $I_{D1}$ is equal to $I_{D2}$. Thus, the gate voltages $V_1$ and $V_2$ are equal to each other, and $V_{REF}$ is equal to zero.

To create a non-zero $V_{REF}$, a different amount of charge is injected on to one or both of the insulated gates of adjusting transistors 130 and 131. Charge injection is accomplished for adjusting transistor 130 via charge injection input $P_1$, through the drain terminal and on to the insulated gate. Similarly, charge injection is accomplished for adjusting transistor 131 via charge injection input $P_2$, through the drain terminal of adjusting transistor 131 and on to the insulated gate.

Since the insulated gate of adjusting transistor 130 is electrically connected to the insulated gate of differential pair transistor 110 and the insulated gate of adjusting transistor 131 is electrically connected to the insulated gate of differential pair transistor 111, the insulated gate voltage potential of each of the adjusting transistors is equal to the insulated gate potential of the associated differential pair transistor following charge injection. Alternatively, the adjusting transistor and the associated differential pair transistor may be seen as sharing a common insulated gate as opposed to separate gate structures which are electrically connected. Once the respective charges are injected into the circuit 100, the drains of the adjusting transistors 130 and 131 are open and the adjusting transistors 130 and 131 are no longer active.

In the case where different amounts of charge are injected into the adjusting transistors 130 and 131, the differential pair transistors 110 and 111 will each develop a different gate voltage requirement in order to maintain their initial drain currents, respectively. The new gate voltage requirement is dependent upon the amount of charge injected on to the insulated gates of each of the devices. The voltage differences on the insulated gates of differential pair transistors 110 and 111 result in a current differential as between $I_{D1}$ and $I^{1D}$.

This current differential and the resulting drain voltage differential is now inputted into amplifier 140 which produces bias current $I_R$. When bias current $I_R$ propagates through the fixed resistor 150, there results in a voltage potential as between $V_2$ and $V_1$. The circuit 100 shall maintain a gate overdrive voltage $V_V$ on differential pair transistor 110 and a separate gate overdrive voltage $V_2$ on differential pair transistor 111 until such time as $I_{D1}$ is equal to $I_{D2}$. When $I_{D1}$ once again equal $I_{D2}$, the bias current $I_R$ reaches a level to maintain a voltage equilibrium potential as between $V_2$ and $V_1$, through the fixed resistor 150.

$V_{REF}$ is a function of the difference in the amount of charge stored on the insulated gates of the respective device matched pairs, i.e. matched pair 1: adjusting transistor 130 and differential pair transistor 110, and matched pair 2: adjusting transistor 131 and differential pair transistor 111.

The amount of charge stored within each of the two matched pairs is independent of temperature. The resultant overdrive voltages $V_1$ and $V_2$ depend on the electrical and geometric characteristics of differential pair transistors 110 and 111. In the preferred embodiment, because the differential pair transistors 110 and 111 are matched, i.e. having nearly identical geometric and electrical characteristics, the effect of temperature variation on the performance of each of the differential pair transistors 110 and 111 are similarly matched. That is, the effect of temperature variation on differential pair transistor 110 cancels the effect of temperature variation on differential pair transistor 111. Thus, the differential effect of temperature variation is zero.

In alternate embodiments, the differential pair transistors 110 and 111 and the adjusting transistors 130 and 131 may be proportional to each other, as opposed to match pairs. This will yield an equilibrium state where $I_{D1}$ is proportional, rather than equal, to $I_{D2}$. The proportionality as between $I_{D1}$ and $I_{D2}$ may be compensated for in the amplifier 140 to produce a equilibrium state where $V_{REF}$ is equal to zero.

Although the invention has been particularly shown and described with reference to a preferred embodiment thereof, it will be understood by those skilled in the art that changes in form and detail may be made therein without departing from the spirit and scope of the invention.

What is claimed is:

1. A voltage reference circuit, comprising:

a first differential pair transistor;

a second differential pair transistor coupled to the first differential pair transistor;

wherein the first differential pair transistor and the second differential pair transistor have matching geometrical and electrical characteristics;

a first adjusting transistor having a gate coupled to a gate of the first differential pair transistor;

a second adjusting transistor having a gate coupled to a gate of the second differential pair transistor;

wherein the first adjusting transistor and the second adjusting transistor have matching geometrical and electrical characteristics; and a feedback loop coupled to the first differential transistor, the second differential transistor, the first adjusting transistor and the second adjusting transistor for producing a reference voltage;

wherein the reference voltage is adjusted by transferring of charges between the first differential pair transistor and the first adjusting transistor via the gate of the first differential pair transistor being coupled to the gate of the first adjusting transistor and the transferring of charges between the second differential pair transistor and the second adjusting transistor via the gate of the second differential pair transistor being coupled to the gate of the second adjusting transistor.

2. The circuit in accordance with claim 1 wherein:

the first adjusting transistor is comprised of an insulated gate; and the first differential pair transistor is comprised of an insulated gate;

and the insulated gate of the first adjusting transistor is electrically connected to the insulated gate of the first differential pair transistor.

3. The circuit in accordance with claim 1 wherein:

the second adjusting transistor is comprised of an insulated gate; and the second differential pair transistor is comprised of an insulated gate;

and the insulated gate of the second adjusting transistor is electrically connected to the insulated gate of the second differential pair transistor.

4. The circuit in accordance with claim 1 further comprising:

a first current load coupled to the first differential pair transistor for producing a first drain current; and a second current load coupled to the second differential pair transistor for producing a second drain current.

5. The circuit in accordance with claim 4 wherein an equilibrium state exists when the first drain current is approximately equal to the second drain current.

6. The circuit in accordance with claim 4 wherein the feedback loop comprises:

an amplifier comprising:

a first amplifier input coupled to the first differential pair transistor for sensing the first drain current;

a second amplifier input coupled to the second differential pair transistor for sensing the second drain current; and an amplifier output for providing a bias current;

a resistor coupled to the amplifier output; and a bias current source coupled to the amplifier.

7. The circuit in accordance with claim 6 further comprising:

an first output node coupled to a first terminal of the resistor; and a second output node coupled to a second terminal of the resistor;

wherein the reference voltage is produced as between the first output node and the second output node.

8. The circuit in accordance with claim 4 further comprising:

a first charge injection input coupled to the first adjusting transistor; and a second charge injection input coupled to the second adjusting transistor.

9. The circuit in accordance with claim 8 wherein a non-equilibrium state is initiated when:

a first charge is injected on to the first charge injection input; or a second charge is injected on to the second charge injection input; or a first charge is injected on to the first charge injection input and a second charge is injected on to the second charge injection input.

10. The circuit in accordance to claim 9 wherein the non-equilibrium state exists when the first drain current is unequal to the second drain current.

11. A voltage reference circuit, comprising:

a first transistor matched pair, comprising:

a first adjusting transistor; and a first differential pair transistor having a gate coupled to a gate of the first adjusting transistor;

a second transistor matched pair, comprising:

a second adjusting transistor; and a second differential pair transistor having a gate coupled to a gate of the second adjusting transistor;

wherein the first differential pair transistor and the second differential pair transistor have matching geometrical and electrical characteristics and the first adjusting transistor and the second adjusting transistor have matching geometrical and electrical characteristics; and a feedback loop coupled to the first transistor matched pair and to the second transistor matched pair for producing a reference voltage;

wherein the reference voltage is adjusted by transferring of charges between the first differential pair transistor and the first adjusting transistor via the gate of the first differential pair transistor being coupled to the gate of the first adjusting transistor and the transferring of charges between the second differential pair transistor and the second adjusting transistor via the gate of the second differential pair transistor being coupled to the gate of the second adjusting transistor.

12. The circuit in accordance with claim 11 wherein:

the first adjusting transistor is comprised of an insulated gate; and the first differential pair transistor is comprised of an insulated gate;

and the insulated gate of the first adjusting transistor is electrically connected to the insulated gate of the first differential pair transistor.

13. The circuit in accordance with claim 11 wherein:

the second adjusting transistor is comprised of an insulated gate; and the second differential pair transistor is comprised of an insulated gate;

and the insulated gate of the second adjusting transistor is electrically connected to the insulated gate of the second differential pair transistor.

14. The circuit in accordance with claim 11 further comprising:

a first current load coupled to the first transistor matched pair for producing a first drain current; and a second current load coupled to the second transistor matched pair for producing a second drain current.

15. The circuit in accordance with claim 14 wherein an equilibrium state exists when the first drain current is approximately equal to the second drain current.

16. The circuit in accordance with claim 15 wherein the feedback loop comprises:

an amplifier comprising:

a first amplifier input coupled to the first transistor matched pair for sensing the first drain current;

a second amplifier input coupled to the second transistor matched pair for sensing the second drain current; and an amplifier output for providing a bias current;

a resistor coupled to the amplifier output; and a bias current source coupled to the amplifier.

17. The circuit in accordance with claim 16 further comprising:

an first output node coupled to a first terminal of the resistor; and a second output node coupled to a second terminal of the resistor;

wherein the reference voltage is produced as between the first output node and the second output node.

18. The circuit in accordance with claim 16 further comprising:

a first charge injection input coupled to the first transistor matched pair; and a second charge injection input coupled to the second transistor matched pair.

19. The circuit in accordance with claim 18 wherein a non-equilibrium state is initiated when:

a first charge is injected on to the first charge injection input; or a second charge is injected on to the second charge injection input; or a first charge is injected on to the first charge injection input and a second charge is injected on to the second charge injection input.

20. The circuit in accordance to claim 19 wherein the bias current produces:

a first overdrive voltage, which is coupled to the first differential transistor; and a second overdrive voltage, which is coupled to the second differential transistor;

wherein the first overdrive voltage and the second overdrive voltage restore the circuit to the equilibrium state.

* * * * *